United States Patent [19]

Keller

[11] Patent Number: 5,783,102
[45] Date of Patent: Jul. 21, 1998

[54] NEGATIVE ION DEDUCTIVE SOURCE FOR ETCHING HIGH ASPECT RATIO STRUCTURES

[75] Inventor: John Howard Keller, Newburgh, N.Y.

[73] Assignee: International Business Machines Corporation, Armonk, N.Y.

[21] Appl. No.: 595,438

[22] Filed: Feb. 5, 1996

[51] Int. Cl.⁶ .................................................. H05H 1/00
[52] U.S. Cl. .................. 216/68; 156/345; 204/298.37; 438/732; 438/729
[58] Field of Search .......... 156/345; 204/298.37; 118/723 MA, 723 MR, 723 E, 723 I, 723 IR; 216/68, 70; 438/729, 732

[56] References Cited

U.S. PATENT DOCUMENTS

| | | | |
|---|---|---|---|
| 4,158,589 | 6/1979 | Keller et al. | 156/345 |
| 4,987,346 | 1/1991 | Katzschner et al. | 315/111.41 |
| 5,030,885 | 7/1991 | Holmes | 315/111.31 |
| 5,133,825 | 7/1992 | Hakamata et al. | 156/345 |
| 5,133,826 | 7/1992 | Dandl | 156/345 |
| 5,225,024 | 7/1993 | Hanley et al. | 156/345 |
| 5,242,538 | 9/1993 | Hamrah et al. | 156/345 X |
| 5,279,669 | 1/1994 | Lee | 118/723 MR |
| 5,292,370 | 3/1994 | Tsai et al. | 156/345 |
| 5,444,207 | 8/1995 | Sekine et al. | 156/345 X |
| 5,556,501 | 9/1996 | Collins et al. | 156/345 |

FOREIGN PATENT DOCUMENTS 63-5527  1/1988  Japan .

*Primary Examiner*—Thi Dang
*Attorney, Agent, or Firm*—Whitham, Curtis & Whitham; Alison Mortinger

[57] ABSTRACT

A method of manufacturing semiconductor chips uses negative plasma etching. The plasma may be produced by an inductive plasma source. A magnetic field is used to reduce diffusion of hot electrons, producing a uniform negative plasma to etch a work piece.

17 Claims, 7 Drawing Sheets

NEGATIVE ION DEDUCTIVE SOURCE FOR ETCHING HIGH ASPECT RATIO STRUCTURES

BACKGROUND OF THE INVENTION

1. Field of the Invention

The present invention generally relates to plasma processing of semiconductor wafers in the manufacture of integrated circuits (ICs) and, more particularly, to an apparatus and a method for producing a uniform negative ion plasma for plasma processing.

2. Background Description

Plasmas excited by radio frequency (RF) or microwave power are widely used in the fabrication of microelectronic devices. Plasma processing is an indispensable technology in the manufacture of very large scale integrated (VLSI) circuits. Plasma-assisted etching techniques have replaced chemical etching, and sputtering has replaced evaporation for the deposition of metals. Plasma enhanced chemical vapor deposition (PECVD) is an alternative to conventional low pressure CVD techniques.

In etching high aspect ratio structures as in gate etching, contact hole etching or trench etching, the electrons which reach the wafer are low in energy directed towards the wafer compared to the ions. This causes the electrons to strike the top of the structure. If any part of the structure is an insulator, the ions will cause charging at the bottom of the structure. This then causes notching in the over etching of the gate polysilicon, reactive ion etch (RIE) lag, and in trench etching it can cause poor profiles at the bottom of the trench. The problems will increase as aspect ratios for these structures get larger.

Severe notching problems have been found in etching gate structures in developing 64 megabyte (MB) and 256 MB dynamic random access memories (DRAMs). This problem is probably worse when using electron cyclotron resonance (ECR) instead of inductive plasma sources and when—photoresists instead of hard masks are used. To help reduce the problem, some people have used plasma pulsing of 10 micro seconds (µsec) on and 10 µsec off. In the after glow during the 10 µsec of off time, the electron temperature cools and the negative chlorine ion density increases while the electron density decreases. Thus, the radio frequency (RF) bias during this after glow decreases while the RF voltage remains the same or increases. The net effect is to increase the forward velocity of the electrons and negative ions which are extracted from the plasma. This causes a large reduction of notching and also reduces the threshold shifts. Other researchers have shown that in a 10:1 hole in an oxide the ion current reaching the bottom of the hole is reduced by a factor of ten. This is due to the ion optical effect of charging on the sides and bottom of the hole.

The net effect of this is that the ideal plasma source would be one in which the negative ions or electrons and the positive ions have the same directed energy towards the wafer. This can be achieved in a plasma with almost the same number of negative and positive ions and in which the few remaining electrons are cold electrons (i.e. a negative ion plasma). Then both negative and positive ions can be extracted during each RF cycle. Pulsing the plasma may accomplish this for a short time during the pulse cycle, but the ideal is to have this condition during the whole time.

SUMMARY OF THE INVENTION

It is therefore an object of the present invention to provide a method for producing a uniform negative ion plasma for use in the manufacture of microelectronic devices.

According to the invention, such a plasma is produced in a modified inductive or helicon plasma, these being the best etching sources presently used. The high density negative ion plasma source comprises a primary plasma source, a magnetic field for separating the primary plasma source from the negative ion plasma region, a work piece and an RF biasing source to accelerate both negative ions and electrons and positive ions to the work piece or wafer such that the negative ions or electrons have at least 10% of the maximum positive ion energy. The primary plasma source may be an inductive/helicon, ECR or magnetron plasma source. The inductive apparatus is characterized by a magnetic and an inductive structure comprising magnetic rings, square loops, lines or sections of loops or lines which produces a plurality of hot plasmas located near the magnetic nulls such that the plasma is driven by the RF inductive fields. Plasmas from the hot plasma diffuse through the magnetic fields to form a negative ion plasma over the wafer.

The steps of the method according to the invention include first producing a plasma. Then, forcing the plasma to diffuse across a magnetic field toward the wafer. The magnetic field reduces the diffusion of particularly the hot electrons, thus allowing the colder electrons to produce negative ions. The plasma structure must be such that the plasma is efficiently diffused to the wafer and at the same time is uniform at the wafer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
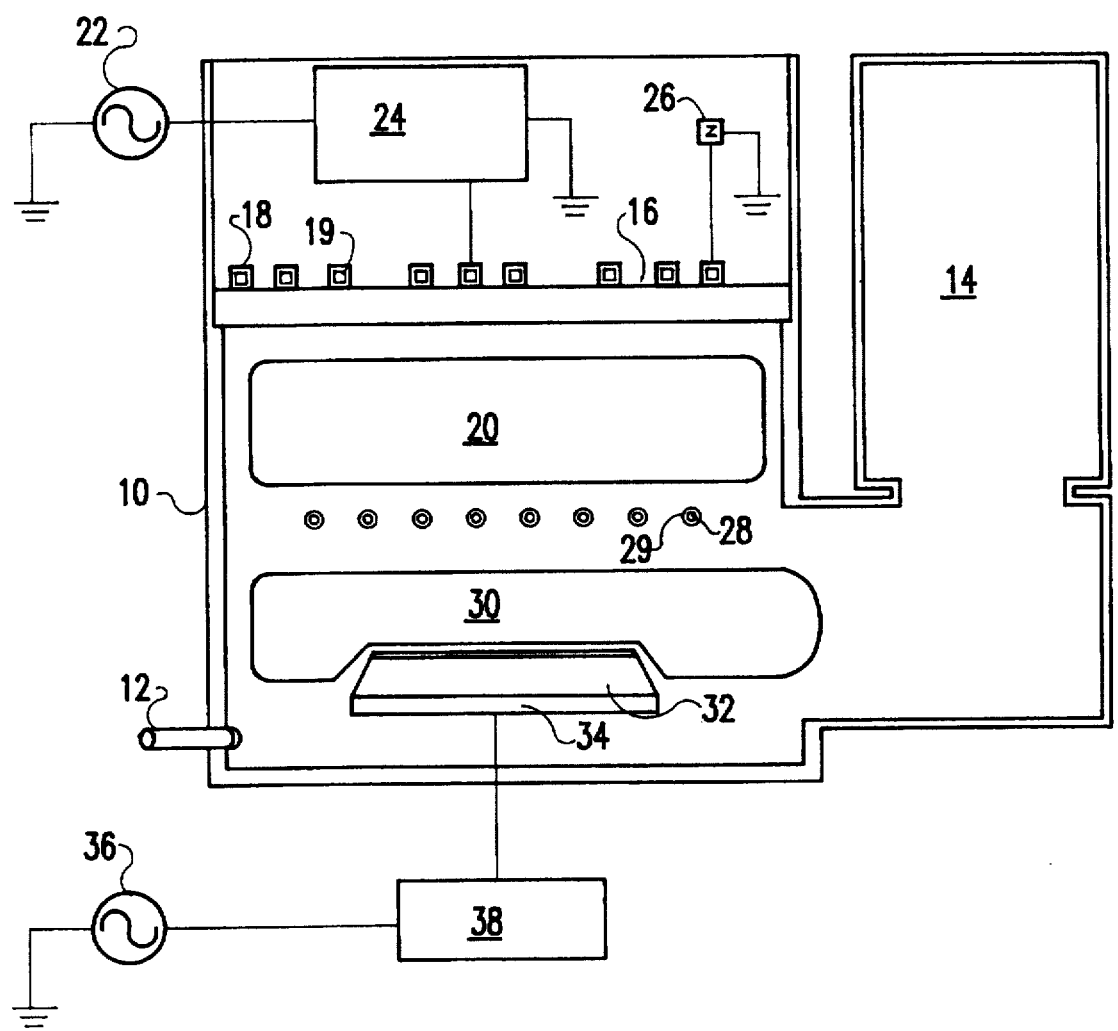
FIG. 1 is a schematic block diagram showing a first embodiment of the present invention.

Referring now to the drawings, and more particularly to FIG. 1, there is shown a schematic block diagram of the basic components of the first embodiment of the invention. A plasma reactor comprises a chamber 10 in which the plasma is generated from a gas at low pressure. The gas is introduced into the chamber 10 via a duct 12, and the chamber is evacuated by a pump 14. The chamber 10 has a dielectric window 16 which separates an RF coil 18 from a hot electron plasma 20 within the chamber. The RF coil 18 is driven by an RF generator 22 through a matching network 24 and connected to ground through an impedance 26. The impedance 26 may be a pure reactance. Optionally, the coil 18 may have magnets 19 inside the coil.

Within the chamber 10 is an array of magnets 28, each of which is surrounded by a dielectric tube 29. A negative ion plasma 30 is formed beneath the array of magnets and above and surrounding a work piece or wafer 32. The work piece or wafer 32 is held by a work piece chuck 34 which also serves as a bias electrode. An RF bias supply 36 is connected to the work piece chuck via a bias matching network 38. The RF biasing source 36 provides an asymmetric bias which serves to accelerate both negative ions and electrons and positive ions to the work piece or wafer 32 such that the negative ions and electrons have at least 10% of the maximum positive ion energy. The bias RF cycle should be long enough to allow for efficient extraction of both the negative ion and positive ions, yet short enough to prevent charging damage. On the other hand, a high frequency RF may be used which will extract dominantly the few remaining cold electrons and the positive ions. Optionally, the work piece chuck 34 may be electrically grounded. This would greatly reduce the forward energy and anisotropic etching, providing a "soft" etch with an ion energy of less than 10 eV. While this is not the preferred embodiment, it can be used in some applications.

Figure 2:
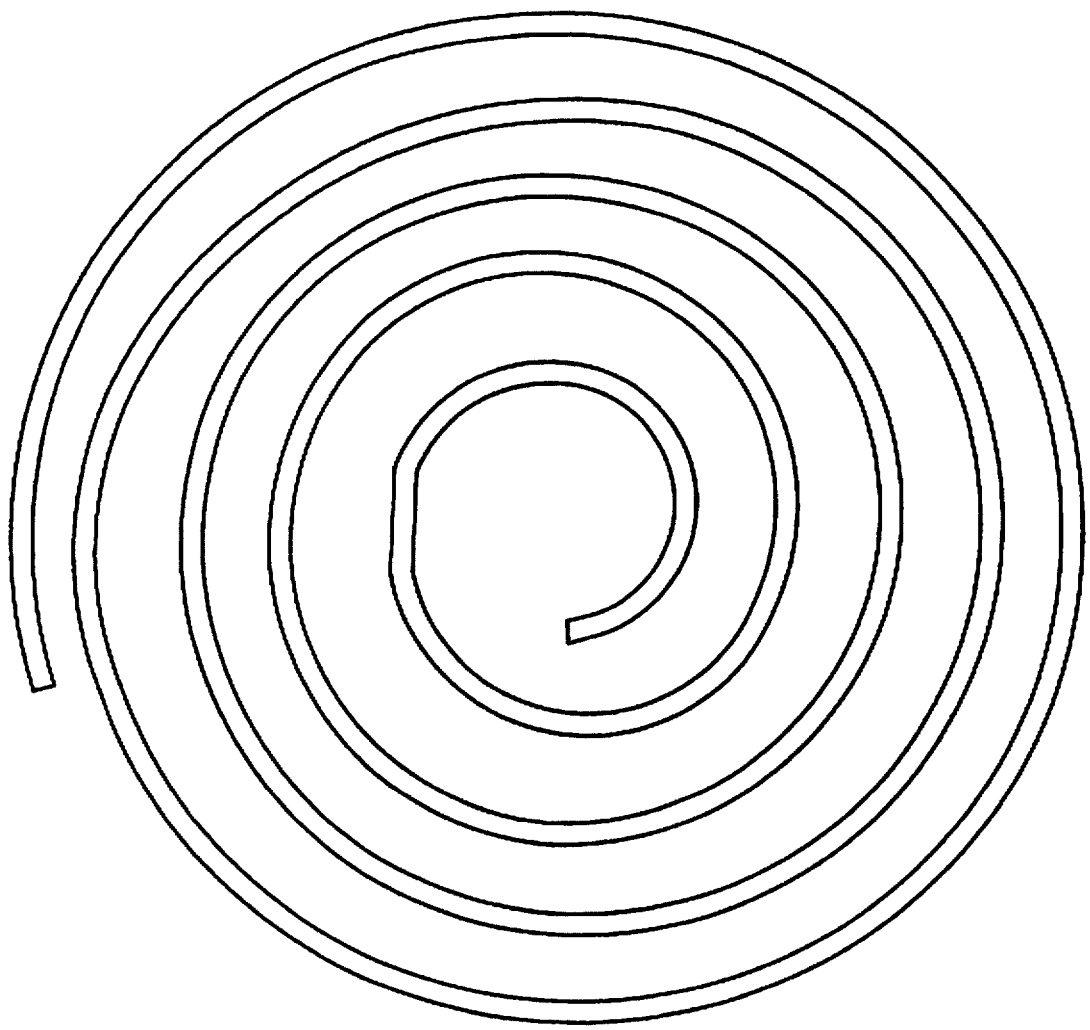
FIG. 2 is a plan view of one example of an RF coil that can used in the structure of FIG. 1.
Figure 3:
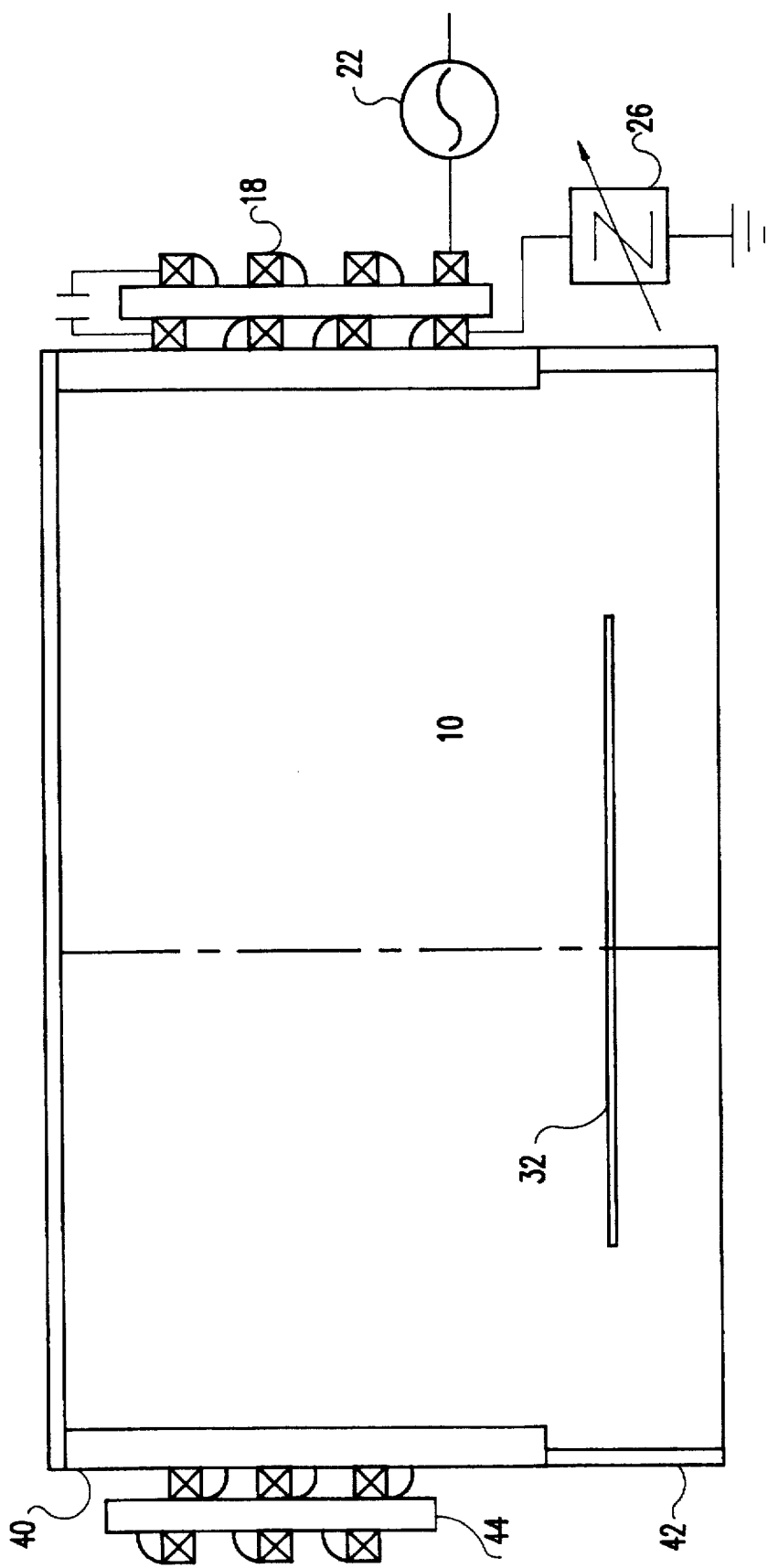
FIG. 3 is a cross-sectional view of another example of an RF coil that can be used in the structure of FIG. 1.

FIG. 2 is a top view of the coil 18 structure and comprises a spiral-like coil. The coil spacing may be made nonuniform to make the hot electron plasma more uniform. A double spiral coil or a layered structure such as described in my copending application Ser. No. 08/467,352 filed Jun. 6, 1995, can be used. The coil can be manufactured with a tubular conductor having a coaxial magnet. The cross-section of the coil material may be circular or rectangular. Alteratively, as shown in FIG. 3, the plasma chamber 10 can have a generally cylindrical shape including the dielectric window 40 and vacuum wall 42. The coil 18 can be wound as a solenoid about this structure and, as illustrated, may be composed of multiple layers, each separated by an insulating layer 44.

Referring back to FIG. 1, the magnets 28 may be optionally surrounded by a conducting tube. This construction would be used, for example, when the conducting tubes are part of the RF inductive circuit. If this construction is used, the tubes are preferably silver coated on the outside to reduce the RF resistance. These conducting tubes are then surrounded by a dielectric tube 29. These tubes form the vacuum barrier between the plasma and the RF coil and magnet structure, and reduce the capacitive coupling losses to the plasma.

Figure 4A:
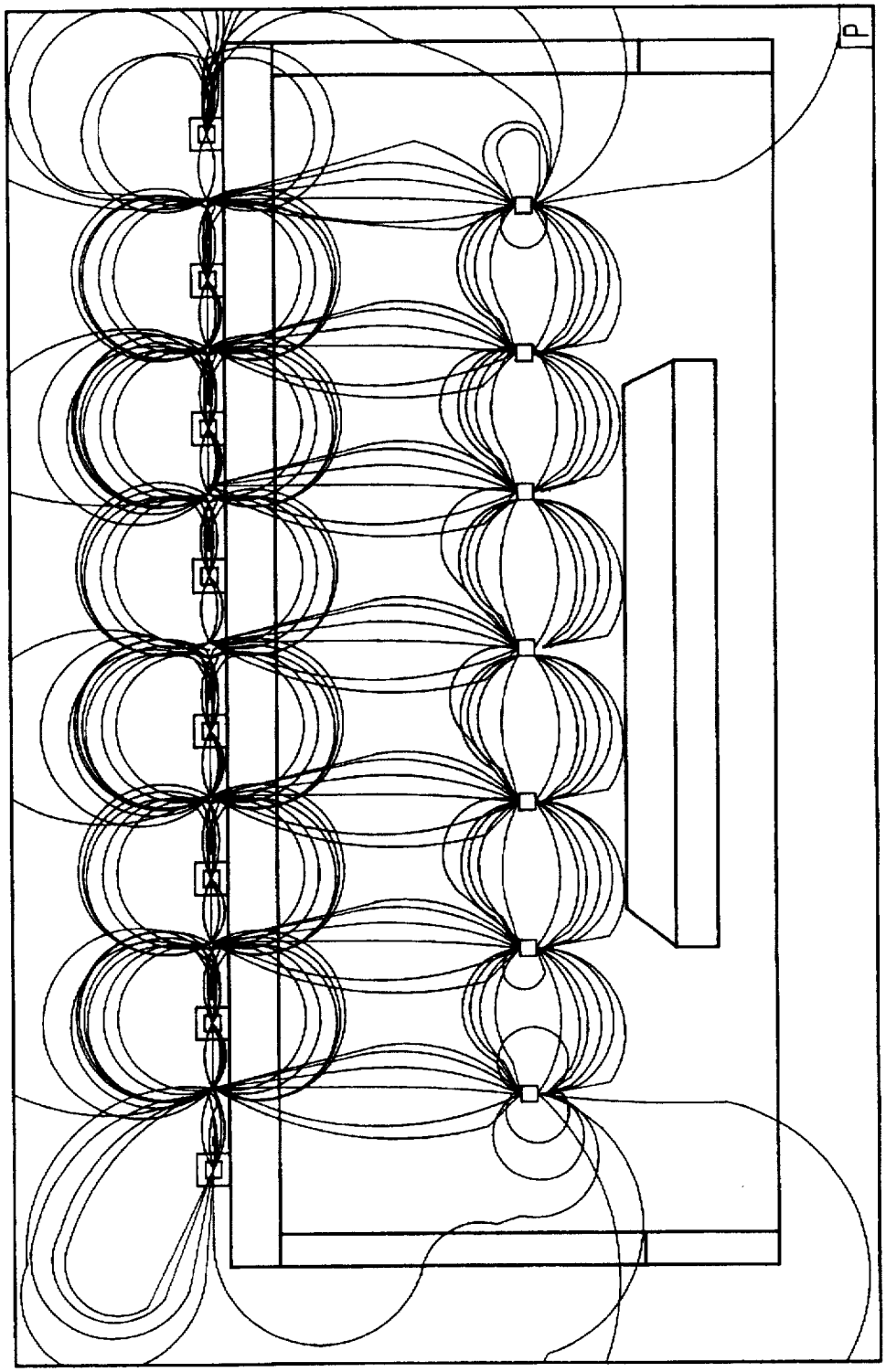
FIG. 4A is a cross-section of the chamber shown in FIG. 1 illustrating magnetic field lines.
Figure 4B:
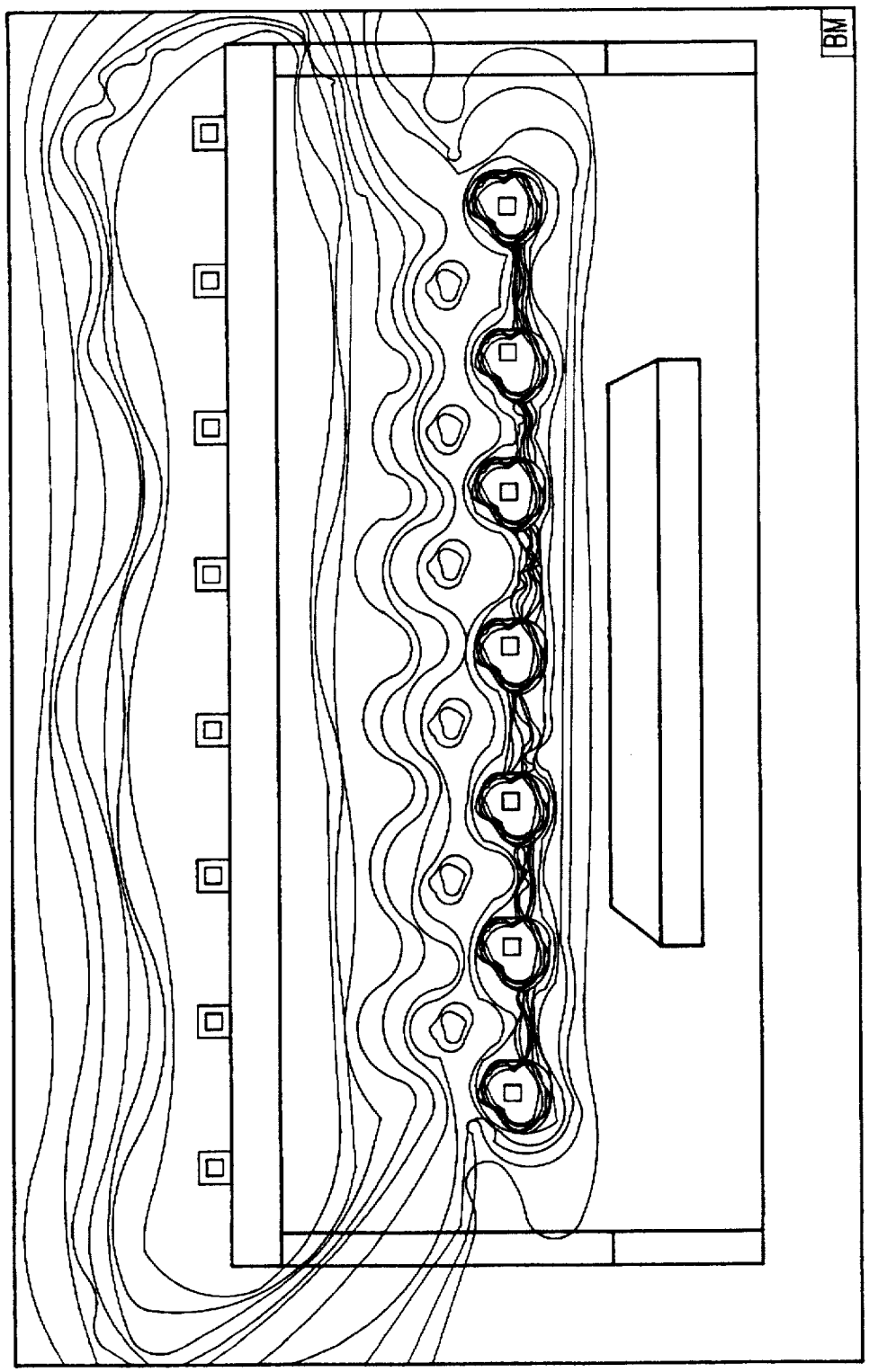
FIG. 4B is a cross-section of the chamber shown in FIG. 1 illustrating magnetic field strength.

FIGS. 4A and 4B are cross-sectional views of the plasma chamber 10 shown in FIG. 1 and show respectively the magnetic field lines and field strength produced by the structure of FIG. 1. The rings of plasma are relatively close to the wafer on the side of the chamber opposite the wafer and can also confine the negative ion plasma in the radial direction. These plasmas then diffuse toward the wafer and electrons combine to produce a uniform cold negative ion plasma from which both the positive and negative ions can be extracted.

Figure 5:
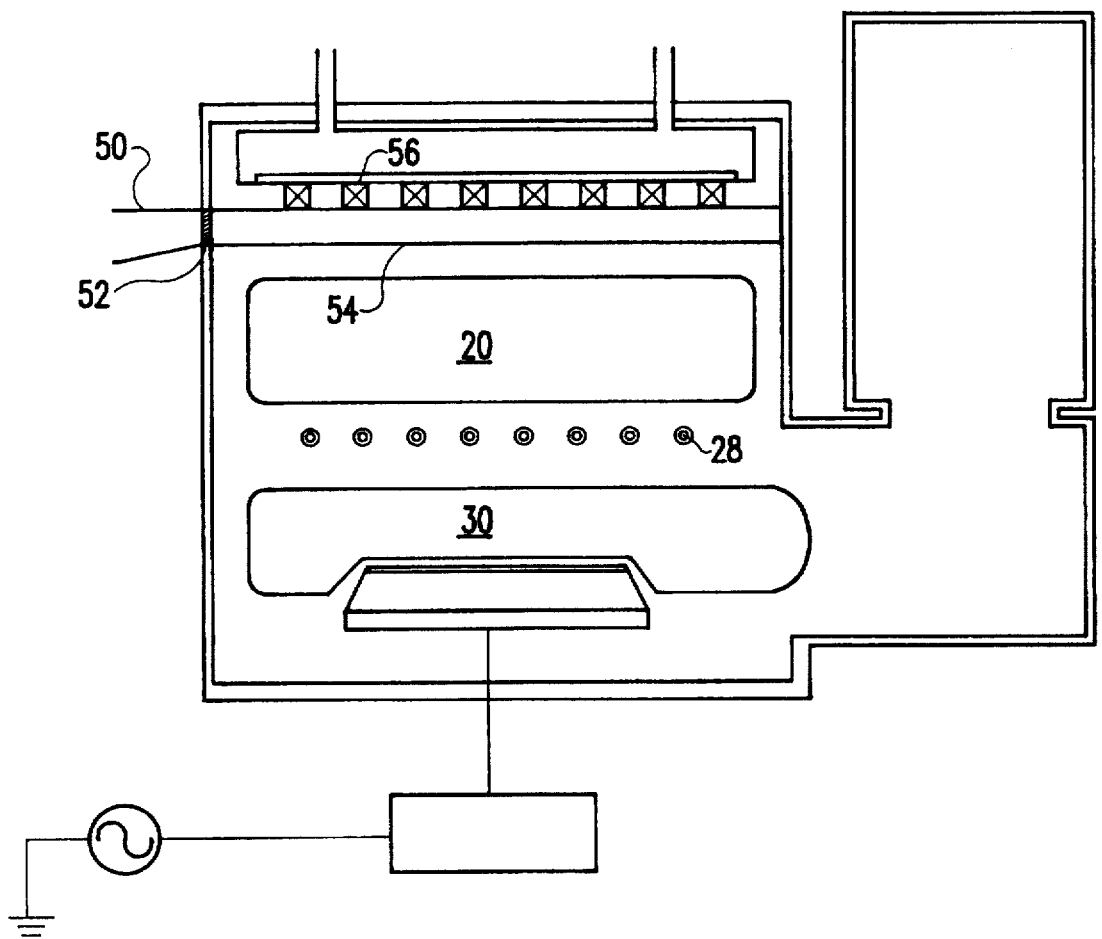
FIG. 5 is a schematic block diagram showing a second embodiment of the present invention.

The hot plasma could also be produced by other means such as electron cyclotron resonance (ECR) and a magnetron source. As shown in FIG. 5, the structure of FIG. 1 is modified to include a microwave waveguide 50 and a dielectric window 52 through which microwave energy is introduced to a slotted waveguide 54 within chamber 10. On the upper side of the slotted waveguide 54 are a plurality of ECR magnets 56. The hot plasma 20 is generated on one side of a magnet array 28 and then allowed to diffuse through the magnetic field produced by magnet array 28 to the side nearest the wafer. In this way the cold electrons which more easily diffuse through the magnetic field will produce the negative ion plasma. The magnetic field near the wafer is preferably less than 5 Gauss.

Figure 6:
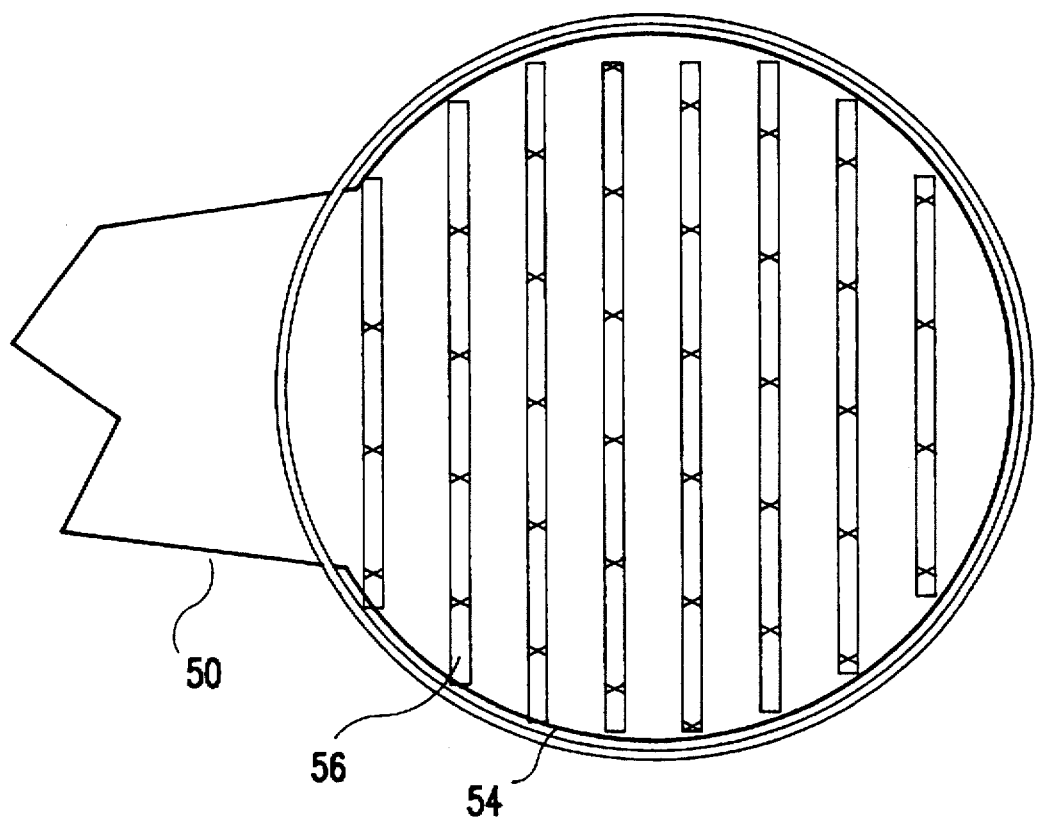
FIG. 6 is a plan view showing the microwave waveguide and ECR magnets used in the structure of FIG. 5.

FIG. 6 shows a plan view of the microwave structure used in the structure of FIG. 5. The waveguide 50 communicates with the slotted waveguide 54 through dielectric window 52. The slotted waveguide (slots not shown in this view) has a shape which conforms to the cross-section of the chamber 10, here shown as circular. The ECR magnets 56 are arrayed on the top side of the slotted waveguide 54. The magnets 56 comprise a plurality of oppositely poled ECR magnets. Microwave power introduced to the plasma chamber 10 through the slotted waveguide produces a hot plasma from which the negative and positive ions diffuse to the work piece or wafer 32.

In each of the embodiments, the magnetic field produced by the magnet structure 28 solves many problems. It separates the hot plasma 20 where both the hot electrons and positive ions are formed from the colder plasma 30 consisting mainly of negative and positive ions. The magnetic field forms magnetic confinement of both the cold plasma, so that its main losses are ions drifting to the wafer, and the hot plasma decreasing its loss to the walls and confining the hot electrons so that they can be heated by the RF or microwave fields and produce more plasma and prevent them from diffusing to cold plasma. In the embodiment shown in FIG. 1, it also reduces the capacitive losses to the RF coil 18. The magnetic structure produces a null in the magnetic field, sometimes called a magnetic neutral loop where the RF coil fields can produce large RF currents in the plasma for heating the plasma. Just adjacent to the magnetic null, the electron cyclotron frequency is in resonance with the RF driving frequency which also heats the electrons in the electron cyclotron resonance mode or ECR.

In other embodiments, the functions of the magnetic field can be isolated such as that presently used in negative hydrogen sources for fusion. In this way, the hot plasma can be produced in one section of the plasma source which can be confined by a magnetic structure if desired. Then, a second part of the magnetic structure causes an isolation between the hot plasma and the colder plasma where the negative ion density is high. This colder plasma should be uniform and located over the wafer so that the RF bias voltage on the wafer can pull both negative and positive ions toward the wafer with roughly the same energy. This pulling of the negative and positive ions of course occurs at different parts of the RF cycle. This RF cycle should be long enough to be able to separately accelerate the different charge ions; however, it should be short enough that the charge build up over a half a cycle is small. The exact optimum frequency will depend on the ion density above the wafer which is being used and the devices being etched. It is expected that this optimum will be between roughly 0.3 MHZ and 40 MHZ.

An asymmetric RF bias can be used such that the positive part of the waveform is shorter and larger. This waveform will produce less bias and increase the forward velocity (energy) of the negative ions and electrons.

The preferred structures have stable plasmas of the desired densities in electronegative gases which can be efficiently produced by either the inductive or distributed ECR means. However, any normal plasma source may be used to produce the hot electron plasma, including a magnetron plasma source. Thus, while the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A method of etching a work piece with a negative ion plasma comprising the steps of:

providing a work piece on a chuck within an etching chamber;

generating a primary plasma within said etching chamber;

separating the primary plasma from a cold plasma region with a magnetic field, said chuck being located in said cold plasma region;

supplying an asymmetric RF bias signal to said chuck, said asymmetric RF bias signal having a cycle sufficient to accelerate negatively and positively charged ions with little charge accumulation during either half cycle and providing negative ions and electrons with a directive energy equal to at least 10% of a maximum positive ion energy, said magnetic field producing a plurality of hot plasmas located near a magnetic null in said primary plasma, such that plasmas from said hot plasmas diffuse through said magnetic field to form a uniform negative ion plasma over said work piece in said cold plasma region; and etching said work piece with said negative ion plasma.

2. The method of etching a work piece with a negative plasma recited in claim 1 wherein structures on said work piece to be etched have an aspect ratio (height to width) of over two.

3. The method of etching a work piece with a negative plasma recited in claim 2 wherein said work piece is a silicon wafer used in the manufacture of integrated circuits.

4. The method of etching a work piece with a negative plasma recited in claim 1 wherein in the primary plasma is generated from the group consisting of an inductive, an electron cyclotron resonance (ECR) and a magnetron plasma source.

5. A magnetic apparatus for producing a negative ion plasma for etching a work piece comprising:

a primary plasma source for generating hot electron plasmas in a hot plasma region;

an array of magnets arranged to generate a magnetic field, such that said generated magnetic field separates said hot plasma region from a cold plasma region, said magnets in said array of magnets being spaced apart from each other sufficiently to allow negative ions and electrons to diffuse from said hot plasma region through said magnetic field and form a negative ion plasma in said cold plasma region;

a work piece chuck in said cold plasma region, said work piece chuck serving to hold a work piece being etched by said negative ion plasma; and an asymmetric RF bias source for biasing any said work piece being held by said work piece chuck and providing said negative ions and electrons with a directive energy equal to at least 10% of a maximum positive ion energy, such that positive ions, negative ions and electrons are accelerated toward said workpiece by said asymmetric RF bias source, said negative ion plasma being uniform over said work piece.

6. The magnetic apparatus for producing a negative ion plasma for etching a work piece recited in claim 5 wherein said primary plasma source is selected from the group consisting of an inductive/helicon, electron cyclotron resonance, and magnetron plasma source.

7. The magnetic apparatus for producing a negative ion plasma for etching a work piece recited in claim 5 wherein said primary plasma source is an inductive/helicon plasma source having a magnetic field structure selected from the group consisting of magnetic rings, square loops, lines, and sections of lines and loops.

8. The magnetic apparatus for producing a negative ion plasma for etching a work piece recited in claim 5 wherein said work piece chuck is a wafer chuck for holding silicon wafers in the manufacture of integrated circuits.

9. The method of etching a work piece recited in claim 3 wherein said etching step is selected from the group consisting of a polysilicon gate etch, an oxide hole etch, line etch, and a trench etch.

10. The magnetic apparatus for producing a negative ion plasma for etching a work piece recited in claim 5 wherein said plurality of hot plasmas are located both on a top and to a side of said work piece.

11. The magnetic apparatus for producing a negative ion plasma for etching a work piece recited in claim 5 wherein said magnetic field confines said negative plasma.

12. The magnetic apparatus for producing a negative ion plasma for etching a work piece recited in claim 5 wherein said magnetic apparatus confines said hot plasma from a plurality of system walls.

13. The magnetic apparatus for producing a negative ion plasma for etching a work piece recited in claim 5 wherein said magnetic field at said wafer is less than 5 Gauss.

14. The magnetic apparatus for producing a negative ion plasma for etching a work piece recited in claim 5 wherein said hot plasma source operates in pulsed mode.

15. The magnetic apparatus for producing a negative ion plasma for etching a work piece recited in claim 5 wherein said RF source produces a longer negative voltage and a shorter but nearly equal positive voltage.

16. The magnetic apparatus of claim 5 wherein each of said magnets in said array of magnets is surrounded by a dielectric tube.

17. The magnetic apparatus of claim 5 wherein each said magnet's magnetic field in said array of magnets is perpendicular to the workpiece chuck such that each said magnet's magnetic field is perpendicular to any said work piece being etched.

* * * * *